(12) United States Patent
Chae et al.

(10) Patent No.: US 7,309,448 B2
(45) Date of Patent: Dec. 18, 2007

(54) SELECTIVE ETCH PROCESS OF A SACRIFICIAL LIGHT ABSORBING MATERIAL (SLAM) OVER A DIELECTRIC MATERIAL

(75) Inventors: Hee Yeop Chae, San Jose, CA (US); Jeremiah T. P. Pender, San Jose, CA (US); Gerardo A. Delgadino, Santa Clara, CA (US); Xiaoye Zhao, Mountain View, CA (US); Yan Ye, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 431 days.

(21) Appl. No.: 10/706,902

(22) Filed: Nov. 12, 2003

(65) Prior Publication Data

US 2005/0029229 A1    Feb. 10, 2005

Related U.S. Application Data

(60) Provisional application No. 60/493,824, filed on Aug. 8, 2003.

(51) Int. Cl.
*B44C 1/22* (2006.01)
*H01L 21/302* (2006.01)

(52) U.S. Cl. .............. 216/66; 216/67; 216/71; 216/72; 216/74; 438/725

(58) Field of Classification Search ............. 216/66, 216/72, 74, 67, 71; 438/725
See application file for complete search history.

(56) References Cited

U.S. PATENT DOCUMENTS

| | | | |
|---|---|---|---|
| 6,268,457 B1 * | 7/2001 | Kennedy et al. | 528/39 |
| 6,323,121 B1 | 11/2001 | Liu et al. | |
| 6,365,529 B1 | 4/2002 | Hussein et al. | |
| 6,448,185 B1 | 9/2002 | Andideh et al. | |
| 6,448,529 B1 | 9/2002 | Hiraishi et al. | |
| 6,465,358 B1 | 10/2002 | Nashner et al. | |
| 6,962,879 B2 * | 11/2005 | Zhu et al. | 438/724 |
| 2001/0027002 A1 | 10/2001 | Matsumoto | |
| 2001/0046772 A1 | 11/2001 | Wang et al. | |
| 2002/0009873 A1 | 1/2002 | Usama | |
| 2002/0031906 A1 | 3/2002 | Jiang et al. | |
| 2002/0168849 A1 * | 11/2002 | Lee et al. | 438/637 |
| 2002/0173143 A1 * | 11/2002 | Lee et al. | 438/637 |
| 2003/0194495 A1 | 10/2003 | Li et al. | |
| 2003/0218427 A1 | 11/2003 | Hoffman et al. | |
| 2004/0132291 A1 * | 7/2004 | Lee et al. | 438/689 |

OTHER PUBLICATIONS

Ultraviolet from Wikipedia, http://en.wikipedia.org/wiki/Deep_ultraviolet; Jan. 26, 2006.*
Kennedy, et al. "An Anthracene-Organosiloxane Spin on Antireflective Coating for KrF Lithography," SPIE 28th Annual Microlithography Conference, Feb. 23, 2003.

* cited by examiner

*Primary Examiner*—Binh X. Tran
(74) *Attorney, Agent, or Firm*—Moser IP Law Group (57) ABSTRACT

A process of selectively etching a sacrificial light absorbing material (SLAM) over a dielectric material, such as carbon doped oxide, on a substrate using a plasma of a gas mixture in a plasma etch chamber. The gas mixture comprises a hydrofluorocarbon gas, an optional hydrogen-containing gas, an optional fluorine-rich fluorocarbon gas, a nitrogen gas, an oxygen gas, and an inert gas. The process could provide a SLAM to a dielectric material etching selectivity ratio greater than 10:1.

41 Claims, 6 Drawing Sheets

ROSS-REFERENCE TO RELATED APPLICATIONS

SELECTIVE ETCH PROCESS OF A SACRIFICIAL LIGHT ABSORBING MATERIAL (SLAM) OVER A DIELECTRIC MATERIAL

CROSS-REFERENCE TO RELATED APPLICATIONS

This application claims benefit of U.S. Provisional Patent Application Ser. No. 60/493,824, filed Aug. 8, 2003, which is herein incorporated by reference.

BACKGROUND OF THE INVENTION

1. Field of the Invention

The present invention generally relates to a method of removing a sacrificial light absorbing material and polymer residues that may remain on a substrate surface and inside openings during damascene structure preparation.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

A dual damascene process is used to create the multilevel, high density metal interconnections needed for advanced, high performance integrated circuits (ICs). The initial transition to dual damascene employed copper metal with traditional silicon dioxide dielectric. More recently, the trend has moved toward the replacement of silicon dioxide dielectric with new low-k dielectric materials, such as carbon doped oxide (CDO).

The adoption of dual damascene copper metallization posed many challenges to the patterning process. Unacceptable variations in substrate reflectivity inhibited the well-controlled patterning of line and space on glass-like interlayer dielectric (ILD). Use of antireflective coating materials to suppress substrate reflectivity is a common practice in the industry. However, applying this technique to dual damascene patterning for sub-0.18 micron technology faces serious challenges in defect elimination and post-etch feature profile control.

A new material known as a sacrificial light absorbing material (SLAM) has recently been developed as an alternative to anti-reflective coating to address the problems mentioned above. SLAM has the light absorbing characteristics that suppress substrate reflectivity. It could be a dyed spin-on-glass ("SOG") or a dyed spin-on-polymer ("SOP") that is deposited by spin coating onto the substrate surface. Various methods of forming a dual damascene interconnect structure using SLAM are described in U.S. Pat. No. 6,448,185, titled "Method for Making a Semiconductor Device That Has a Dual Damascene Interconnect", issued Sep. 10, 2002, and U.S. Pat. No. 6,365,529, titled "Method for Patterning Dual Damascene Interconnects Using a Sacrificial Light Absorbing Material", issued Apr. 2, 2002.

The SLAM-based dual damascene processes mentioned above address defect elimination and post-etch feature profile control issues. However, the process requires a wet clean step to remove the remaining SLAM and etch residue. A wet clean step in a separate process system is time consuming and is limiting in its capability to control the post-etch feature profile. The term "etch" as recited herein is used broadly to include any material removal processes.

Therefore, a need exists in the art for a method of dry cleaning the sacrificial light absorbing material (SLAM) residue and post-etch polymer residue formed during the dual damascene patterning process.

SUMMARY OF THE INVENTION

The present invention generally relates to a method of dry etching sacrificial light absorbing material (SLAM) residue and photoresist residue formed during fabrication of devices and interconnect structures that use SLAM during the fabrication process.

Embodiments of the invention provide a plasma etch process for selectively etching a SLAM over a dielectric material on a substrate, which comprises etching a layer of SLAM that lies atop a dielectric layer using a gas mixture comprising a hydrofluorocarbon gas, an optional hydrogen-containing gas, an optional fluorine-rich fluorocarbon gas, a nitrogen-containing gas, an oxygen-containing gas and an inert gas. The sacrificial light absorbing material is, for example, TESAC dyed methylsiloxane polymer. The dielectric material is, for example, a carbon doped oxide with 1 to 50% atomic weight carbon content.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The invention is described within the context of a method of forming a dual damascene structure. Although use of the invention to form a dual damascene structure is one embodiment of the invention, those skilled in the art will understand that the invention may find use in any embodiment where sacrificial light absorbing material (SLAM) residue is etched. FIGS. 1A-1I illustrate cross-sectional views that show structures that result after various processing steps to make a copper containing dual damascene interconnect structure. For clarity, these figures are not drawn to scale. A first conductive layer 101 is formed on substrate 100. The conductive layer 101 may be made from materials conventionally used to form conductive layers for integrated circuits, such as copper, copper alloy, aluminum, aluminum alloy, polysilicon, silicide and the like. After forming the conductive layer 101 on substrate 100, a barrier layer 102 is formed on the conductive layer 101.

Figure 1A:
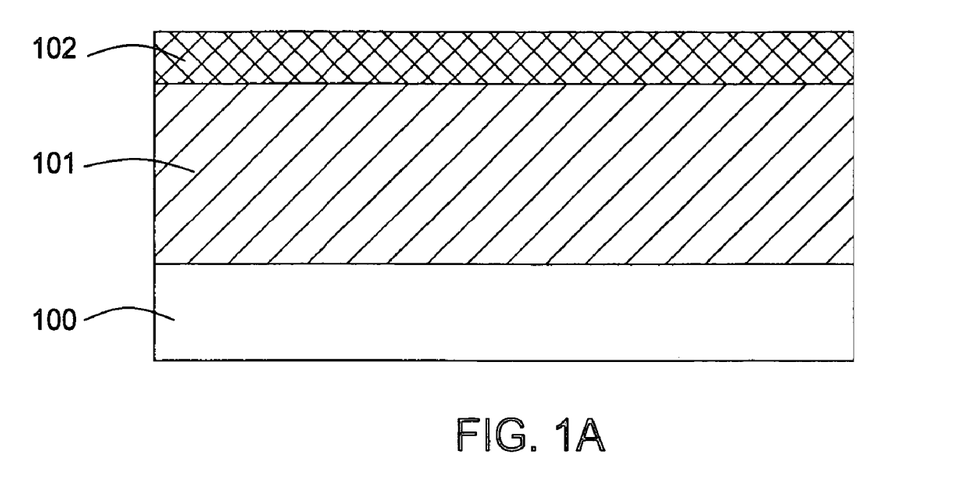
FIGS. 1A-1I illustrate schematic cross-sections of structures that result after different process steps of making a copper containing dual damascene structure.
Figure 1B:
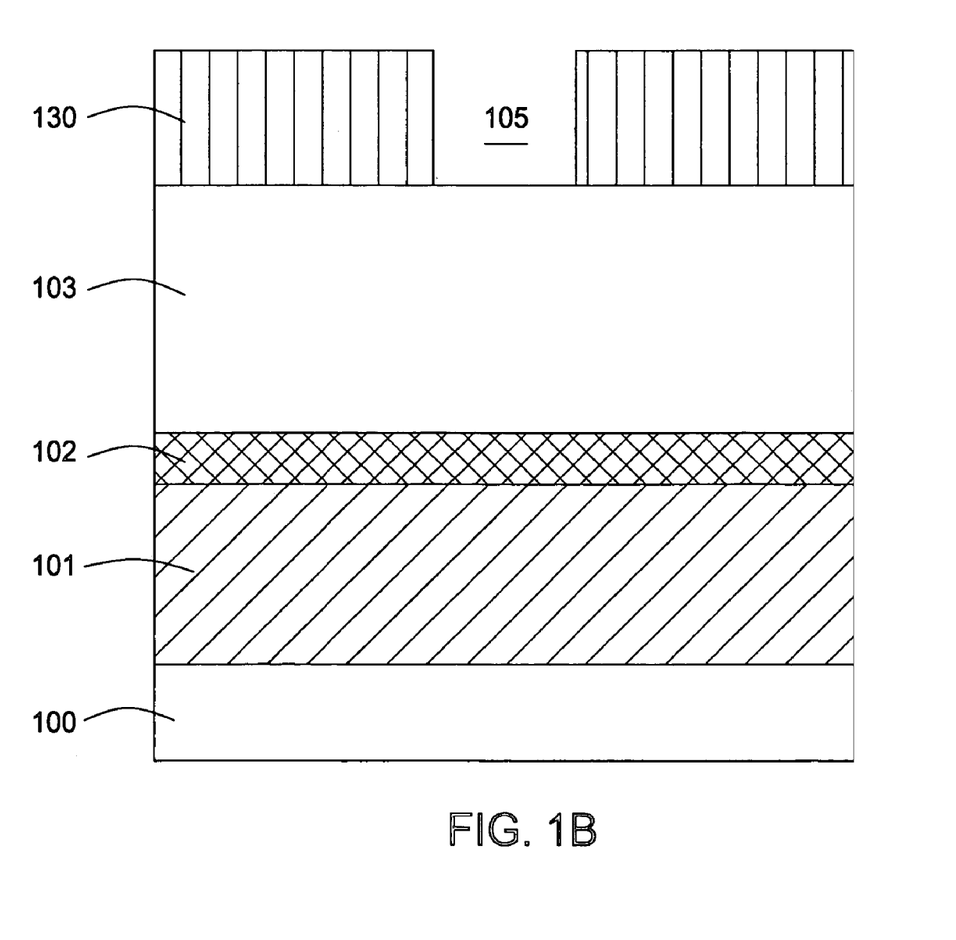
Figure 1C:
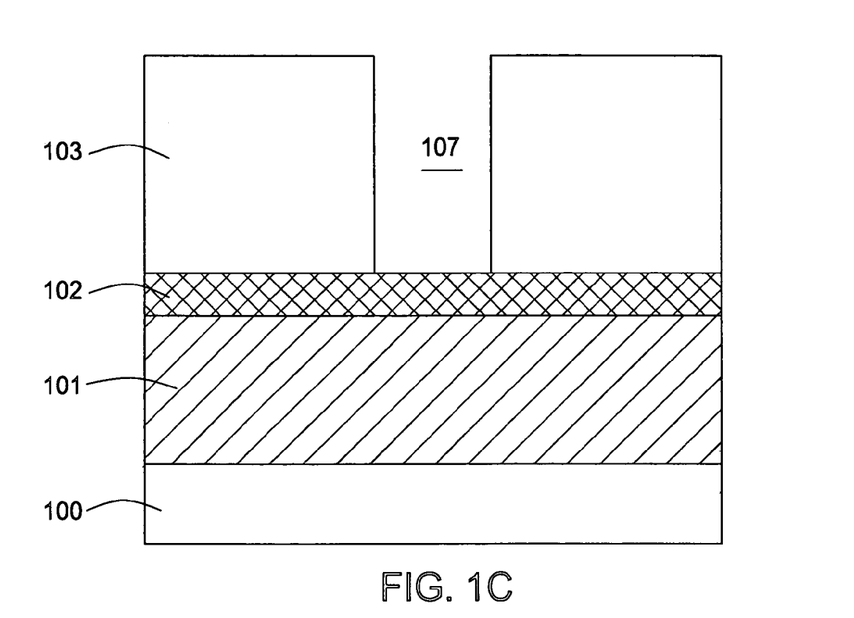

Barrier layer 102 will serve to prevent an unacceptable amount of copper, or other metal, from diffusing into dielectric layer 103. Barrier layer 102 also acts as an etch stop layer (ESL) to prevent subsequent via and trench etch steps from exposing conductive layer 101 to subsequent etching and cleaning processes. Barrier layer 102 could be made from silicon nitride, silicon carbide or other suitable materials. Barrier layer 102 should be thick enough to perform its diffusion inhibition and etch stop functions, but not so thick that it adversely impacts the overall dielectric characteristics of the combined barrier layer 102 and dielectric layer 103.

A dielectric layer 103 is then formed on top of the barrier layer 102. The dielectric layer 103 could be up-doped silicon glass (USG), fluorine-doped silicon glass (FSG), silicon dioxide, polytetrafluoroethylene (PTFE), or a carbon doped oxide (CDO) film. For convenience, carbon doped oxide (CDO) will be used as an example in many occasions below to describe the invention. Carbon doped silicon oxide (CDO) is an oxidized organo-silane material. The organo-silane compounds are oxidized during deposition by reaction with oxygen ($O_2$) or oxygen containing compounds such as nitrous oxide ($N_2O$) and hydrogen peroxide ($H_2O_2$), such that the carbon content of the film is from 1% to 50% by atomic weight, and in one specific embodiment is about 20%. The oxidized organo-silane layer has a dielectric content of about 3.0. Carbon, including some organo functional groups, remaining in the oxidized organo layer contributes to low dielectric constants and good barrier properties providing a barrier that inhibits for example diffusion of moisture or metallic compounds. Examples of CDO include BLACK DIAMOND™ available from Applied Materials, Inc. located in Santa Clara, Calif., Coral™, available from Novellus Systems, located in San Jose, Calif., and Aurora™, available from ASM International, located in Amsterdam. Details of methods of preparing the BLACK DIAMOND™ film have been disclosed in commonly assigned U.S. patent application Ser. No. 10/121,284, titled "Crosslink Cyclo-Siloxane Compound With Linear Bridging Group To Form Ultra Low K Dielectric", filed on Apr. 11, 2002, and U.S. patent application Ser. No. 10/302,393, titled "Method For Forming Ultra Low K Films Using Electron Beam", filed on Nov. 22, 2002. Typically, the thickness of the dielectric layer is between about 2,000 and about 30,000 angstroms.

After forming dielectric layer 103, a photoresist layer 130 is deposited on top of the dielectric layer to define a via formation. An optional hard mask layer can be deposited on the dielectric layer before the photoresist layer 130 is formed. Such a hard mask may be desirable when using certain types of material to form dielectric layer 103, as is well known to those skilled in the art. This particular embodiment does not specify forming a hard mask layer on top of dielectric layer 103 prior to applying the photoresist.

After photoresist 130 is conventionally patterned (shown in FIG. 1B) to define a gap 105. Via 107 is etched through dielectric layer 103 to barrier layer 102. Different anisotropic dry dielectric etch processes will be used to etch the dielectric layer to form via, depending on the dielectric material used. The via etch is followed by a photoresist ash and/or clean processes to produce the structure shown in FIG. 1C. Via 107 may be cleaned by using a conventional hydrogen fluoride (HF) in ethylene glycol based wet etch process or by a dry clean process.

Figure 1D:
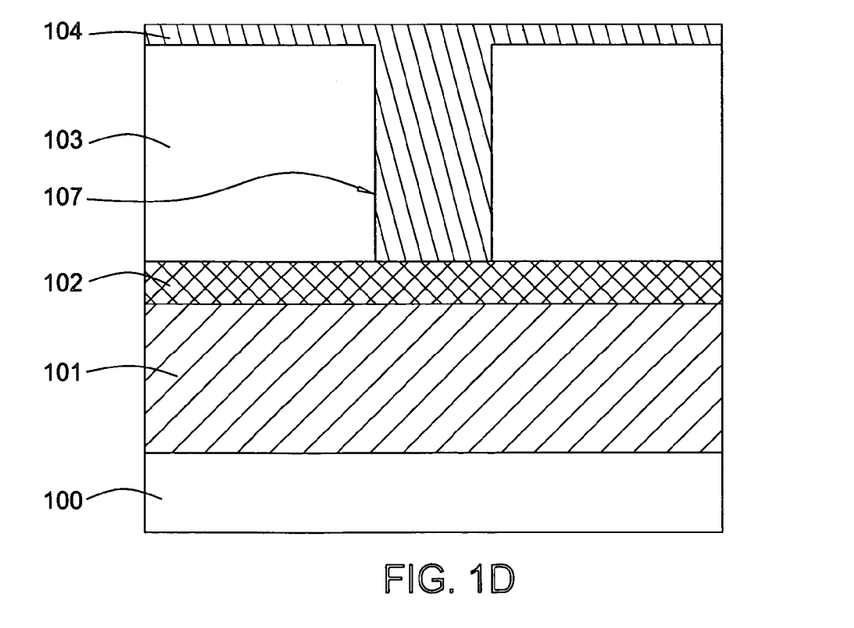
Figure 1E:
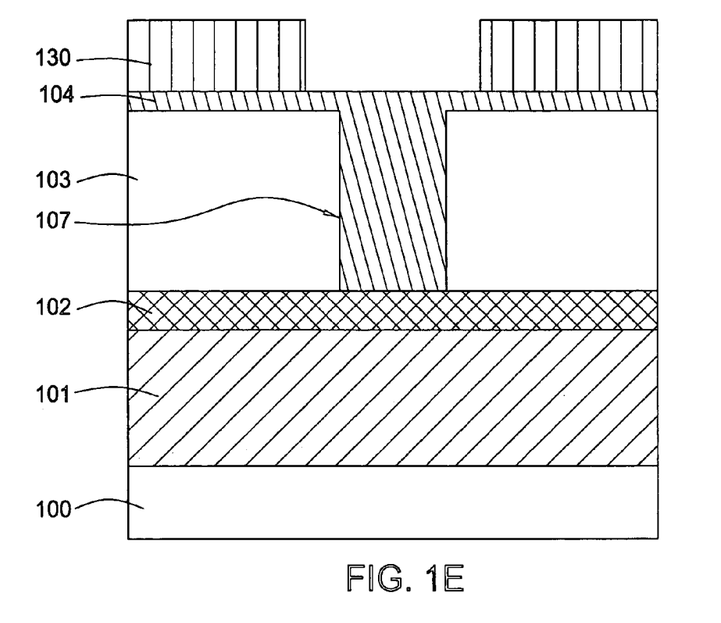

After via 107 is formed through dielectric layer 103, via 107 is filled with a sacrificial light absorbing material ("SLAM") layer 104 (see FIG. 1D). The SLAM layer 104 should have dry etch properties similar to those of dielectric layer 103 during trench etch. Such dry etch properties would enable removal of the SLAM layer when the dielectric layer is etched to form the trench. The SLAM should also have high wet etch or dry etch selectivity compared to the dielectric, such as CDO, during post trench etch clean. Such high etch selectivity would allow removal of SLAM residue without significant dielectric loss during post trench etch clean. Etch selectivity of SLAM over a dielectric, such as CDO, is the ratio of etch rate of SLAM over the etch rate of the dielectric.

SLAM layer 104 could be a dyed spin-on-glass (SOG) or a dyed spin-on-polymer (SOP) that is deposited by spin coating. An example of a SLAM material is DUO248™ made by Honeywell Electronic Materials, Sunnyvale, Calif. DUO248™ is an antireflective polymer comprised of TESAC (9-Anthracene Carboxymethyl Triethoxysilane) and Methylsiloxane. The design of the material is described in an article, titled "An Anthracene-Organosiloxane Spin on Antireflective Coating for KrF Lithorgraphy" SPIE $28^{th}$ Annual Microlithography Conference, Feb. 23, 2003. Typically, about 500 and about 3,000 angstroms of the material is deposited onto the surface of the device. The spin coating process causes the SLAM layer 104 to completely fill the via 107 uniformly. The dyed SOG or SOP greatly reduces, or even eliminates, substrate reflectivity at deep ultraviolet (DUV) wavelengths (157, 193 or 248 nm).

After filling the via 107 with SLAM, a photoresist layer 130 is applied on top of the SLAM layer 104. The photoresist layer 130 is then patterned to define a trench formation (see FIG. 1E). Afterwards, trench 106 is etched into the dielectric layer 103 to form the structure shown in FIG. 1F. The trench etch process should remove the SLAM layer 104 at about the same rate that it removes the dielectric layer 103 (such as a CDO layer), or at a slightly faster rate. The trench etch process can be performed in the same equipment that had been used to etch, and even clean, the via 107.

Figure 1F:
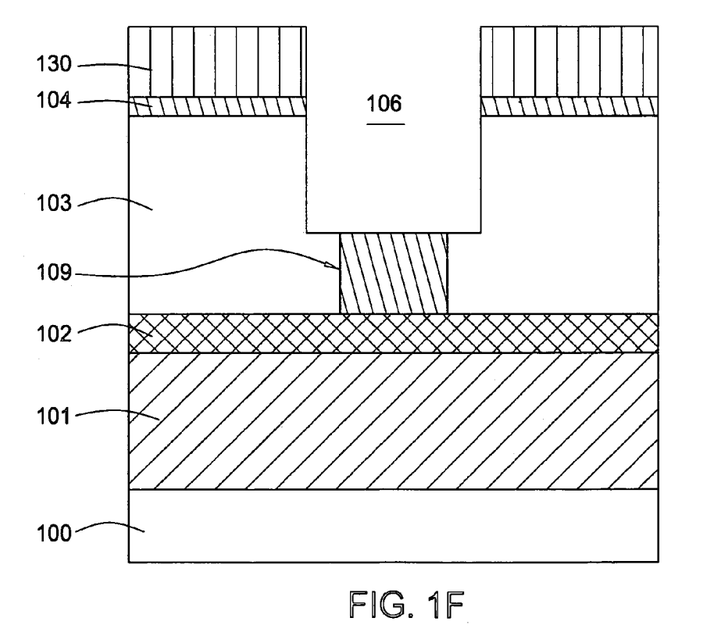

The presence of the remaining portion 109 of the SLAM layer 104, at the bottom the via 107 after trench etch, helps to protect the barrier layer during the trench etch process. Due to this, the trench etch process can be selected to produce superior trench and via profiles without having to consider its effect on the selectivity between the dielectric layer 103 (e.g. a CDO layer) and the barrier layer 102.

After the trench 106 is etched, the remaining portion of the photoresist layer 130 and the remaining portion 109 of the SLAM layer 104 must be removed. If a low temperature, low pressure oxygen based ashing step is used to remove the photoresist layer 130, followed by applying a wet etch process to remove remaining residues, the ashing and clean process may have to be repeated to adequately remove the photoresist and the SLAM residues. In addition to requiring a significant amount of time to complete, such a process is relatively expensive and can modify the etch profile in an unacceptable fashion. Moreover, the oxygen used during an ashing process may react with the carbon, which is contained in the dielectric layer 103, to produce carbon dioxide that is released from the device. Because that reaction depletes the carbon that is included in the dielectric layer, it may cause that layer's dielectric constant to increase significantly, and render the dielectric layer susceptible to cracking and delamination.

For these reasons, a method of employing a forming gas to remove the photoresist layer 130 has been described in U.S. Pat. No. 6,448,185, titled "Method for Making a Semiconductor Device That Has a Dual Damascene Interconnect", issued Sep. 10, 2002. The forming gas in one specific embodiment comprises a plasma that contains hydrogen. Such a hydrogen containing plasma comprises 4% hydrogen in nitrogen in equipment capable of performing the ashing process. Removal of photoresist layer 130 generates the structure shown in FIG. 1G.

Figure 1G:
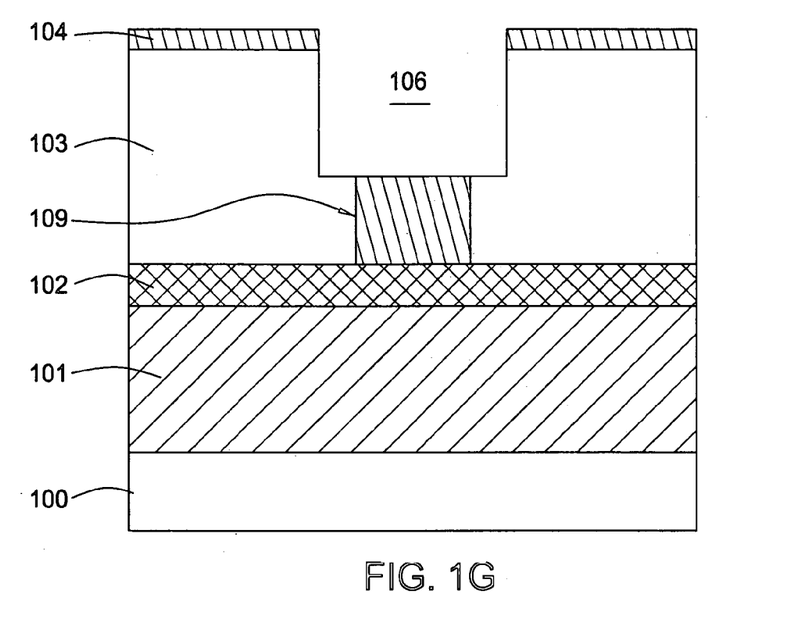
Figure 1H:
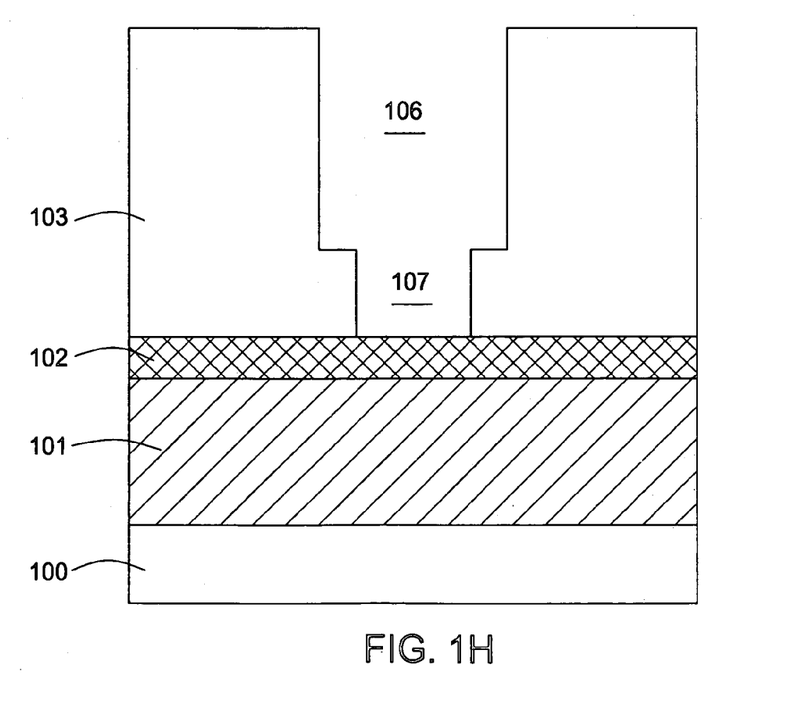

Following the photoresist removal step, remaining portions 109 of the SLAM layer 104 must be removed. In U.S. Pat. No. 6,448,185, this is described to be accomplished by exposing the device to a dilute HF solution that wet etches the SLAM layer at a significantly higher rate than it may wet etch dielectric layer 103 (greater than 10:1). Such a solution comprises a blend of ethylene glycol (or deionized water) and HF in a ratio of between about 6:1 and about 500:1. A wet etch process that uses such a solution removes the remaining SLAM at a substantially faster rate than it removes any of the CDO.

However, wet etch is performed in a separate equipment from the etch system. Transporting wafers and waiting for the wet etch process queue could be time consuming. Dry etch also generally provides better process control. Therefore, it's more desirable to remove the remaining SLAM using a dry etch process to save overall process time and better control the process.

In addition to eliminating a wet etch step, it is also desirable to have a dry etch process that combines the photoresist ashing step with the SLAM removal step. DUV (248 nm) photoresists typically consist of terpolymers or copolymer of polyhydroxystyrene (PHS) of varying ratios of copolymers and monomeric inhibitors. An example of DUV resist is Apex-E® by Shipley, located in Marlborough, Mass. Since SLAM, such as DUO248™ is also a polymer, the etch process developed to etch SLAM should also be able to etch DUV photoresist.

This invention is a highly selective plasma etch process of SLAM over the dielectric material (such as CDO). The plasma process utilizes a mixture of hydrofluorocarbon (HFC), fluorocarbon (optional), oxygen, nitrogen and inert gases to achieve higher than 5:1 selectivity, preferably higher than 10:1, and at an etch rate greater than 200 angstrom per minute, preferably greater than 500 angstrom per minute. The preference of greater than 10:1 etch selectivity allows the removal of SLAM without significant loss of CDO. The etch rate also needs to be high enough (>500 angstrom per minute) to make the process useful in manufacturing integrated circuits.

The dry etch (or clean) process may be practiced, for example, in a dual frequency capacitive plasma source reactor. The dual frequency capacitive plasma source reactor may be included in a processing system such as the CENTURA® semiconductor wafer processing system commercially available from Applied Materials, Inc. of Santa Clara, Calif. The reactor and the specific SLAM removal processes performed in the reactor are discussed in detail below.

Figure 1I:
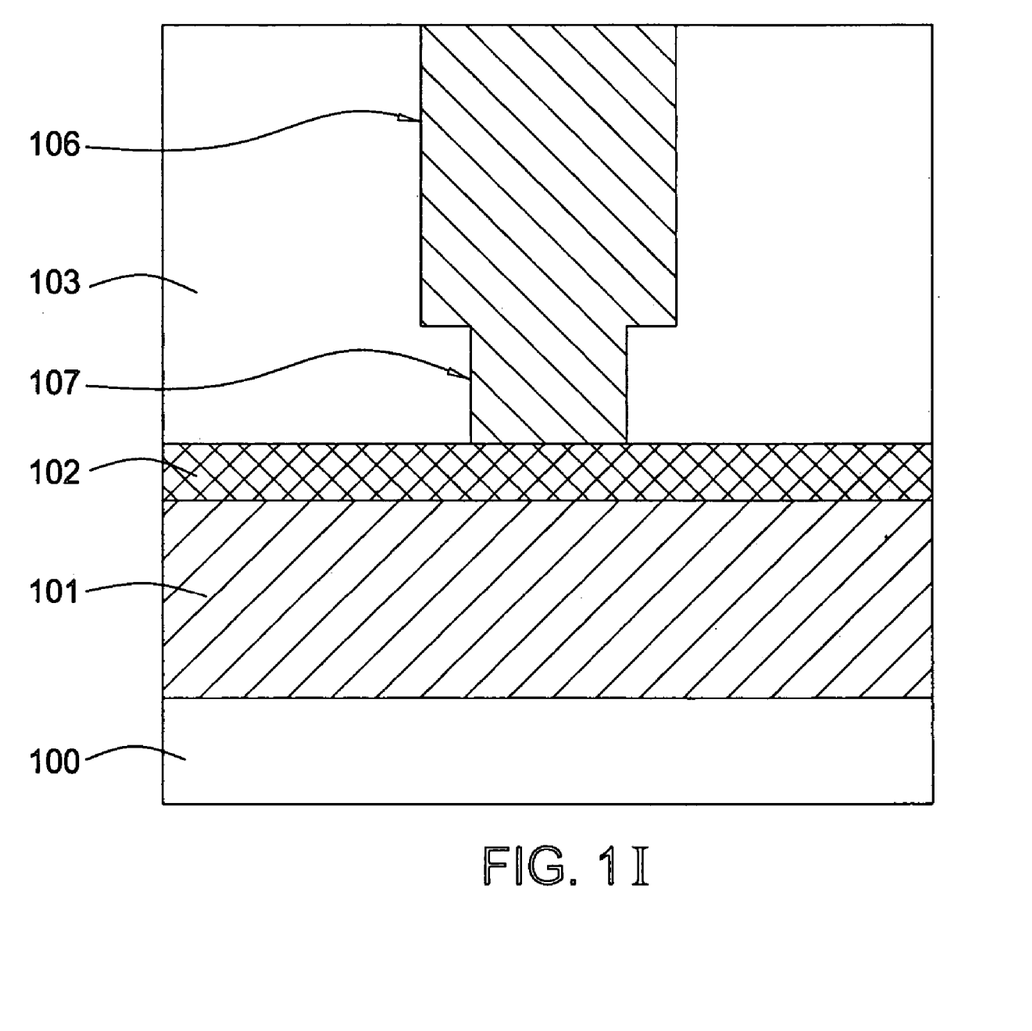

Following removal of the remaining portion 109 of the SLAM layer 104, trench 106 and via 107 are filled with second conductive layer 105. Like conductive layer 101, conductive layer 105 for example comprises copper, and is formed using, for example, a conventional copper electroplating process. When an excess amount of the material used to make layer 105 is formed on the surface of dielectric layer 103, one or more chemical-mechanical polishing (CMP) steps may be applied to remove the excess material and to planarize the surface of layer 105. When an electroplating process is used to form conductive layer 105 from copper, that CMP step (or steps) removes both the excess copper and the underlying barrier layer. FIG. 1I shows the structure that results after filling the trench 106 and the via 107 with a conductive material, then applying a CMP step to remove excess material from the surface of layer 103 to produce conductive layer 105. Although the embodiment shown in FIG. 1I shows only one dielectric layer and two conductive layers, the process described above may be repeated to form additional conductive and dielectric layers until the desired integrated circuit interconnect structure is produced.

In one embodiment of the invention, the reactor used to remove the SLAM is adapted for processing 300 mm wafers, operates in broad ranges of the process parameters and etchant chemistries, may use an endpoint detection system, and has in-situ self-cleaning capabilities. In one embodiment, the reactor uses a VHF (very high frequency) plasma source to produce a high density plasma, a 13.56 MHz wafer bias source and a plasma magnetizing solenoid, such that the reactor provides independent control of ion energy, plasma density and uniformity, and wafer temperature. A detailed description of a suitable dual frequency capacitive plasma source reactor is provided in U.S. patent application Ser. No. 10/192,271, filed Jul. 9, 2002 which is commonly assigned to Applied Materials, Inc., and is herein incorporated by reference in its entirety.

Figure 2:
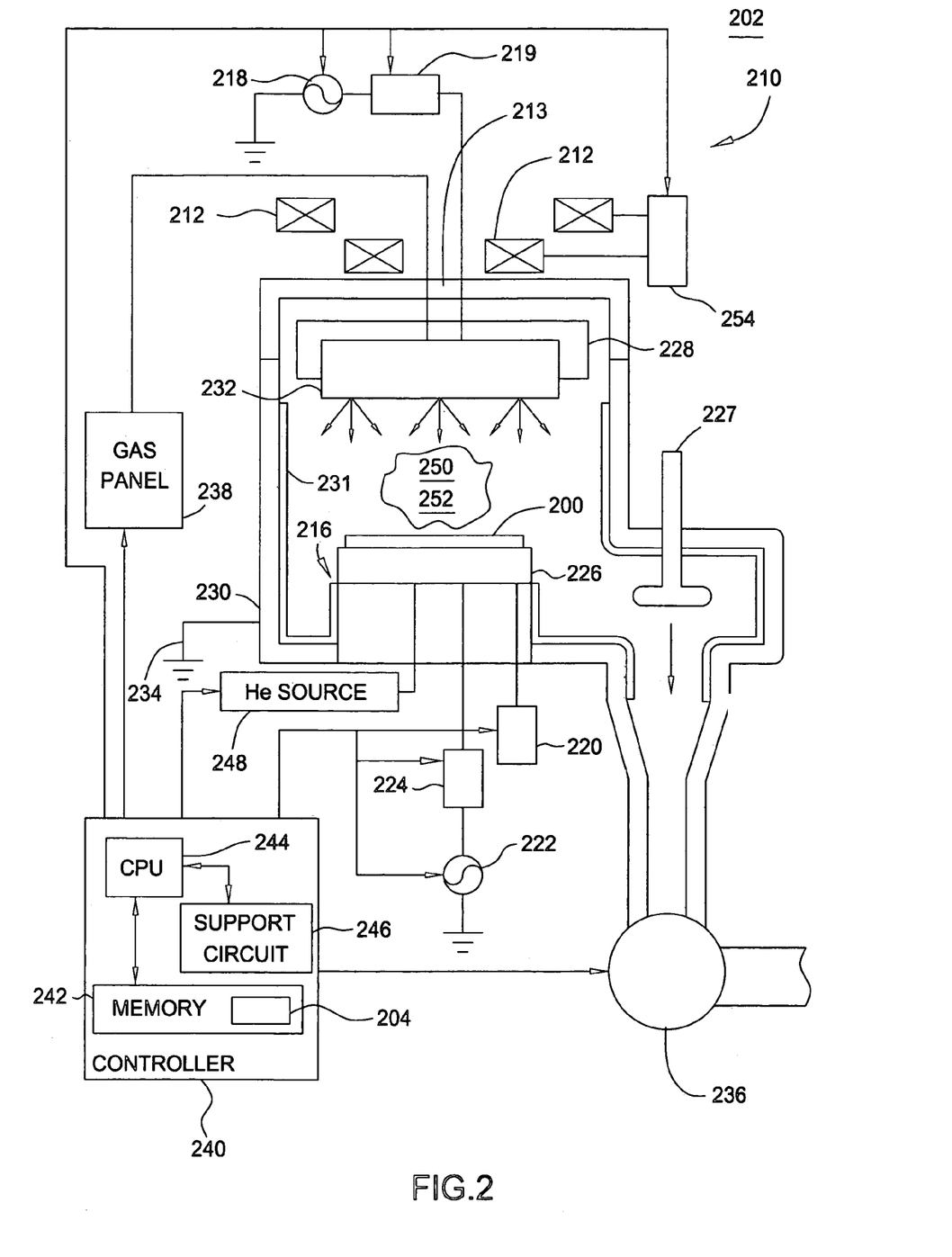
FIG. 2 is a schematic diagram of a plasma processing apparatus that may be used to practice embodiments of the invention described herein.

FIG. 2 depicts a schematic, cross-sectional diagram of a dual frequency capacitive plasma source reactor that may be used to practice the present invention. A reactor 202 comprises a process chamber 210 having a conductive chamber wall 230 that is connected to an electrical ground 234 and at least one solenoid segment 212 positioned exterior to the chamber wall 230. The chamber wall 230 comprises a ceramic liner 231 that facilitates cleaning of the chamber 210. The byproducts and residue of the etch process are readily removed from the liner 231 after each wafer is processed. The solenoid segment(s) 212 are controlled by a DC power source 254 that is capable of producing at least 5 V. Process chamber 210 also includes a wafer support pedestal 216 that is spaced apart from a showerhead 232. The wafer support pedestal 216 comprises an electrostatic chuck 226 for retaining a substrate 200 beneath the showerhead 232. The showerhead 232 may comprise a plurality of gas distribution zones such that various gases can be supplied to the chamber 210 using a specific gas distribution gradient. The showerhead 232 is mounted to an upper electrode 228 that opposes the support pedestal 216. The electrode 228 is coupled to an RF source 218.

The electrostatic chuck 226 is controlled by a DC power supply 220 and the support pedestal 216, through a matching network 224, which is coupled to a bias source 222. Optionally, the source 222 may be a DC or pulsed DC source. The upper electrode 228 is coupled to a radio-frequency (RF) source 218 through an impedance transformer 219 (e.g., a quarter wavelength matching stub). The bias source 222 is generally capable of producing a RF signal having a tunable frequency of 50 kHz to 13.56 MHz and a power of between 0 and 5000 Watts. The source 218 is generally capable of producing a VHF RF signal having a tunable frequency of about 100 to about 200 MHz and a power between about 0 and about 2000 Watts. The interior of the chamber 210 is a high vacuum vessel that is coupled through a throttle valve 227 to a vacuum pump 236. Those skilled in the art will understand that other forms of the plasma etch chamber may be used to practice the invention, including a reactive ion etch (RIE) chamber, an electron cyclotron resonance (ECR) chamber, and the like.

In operation, a substrate 200 is placed on the support pedestal 216, the chamber interior is pumped down to a near vacuum environment, and a gas 250 (e.g., argon), when ignited produces a plasma, is provided to the process chamber 210 from a gas panel 238 via the showerhead 232. The gas 250 is ignited into a plasma 252 in the process chamber 210 by applying the power from the RF source 218 to the upper electrode 228 (anode). A magnetic field is applied to the plasma 252 via the solenoid segment(s) 212, and the support pedestal 216 is biased by applying the power from the bias source 222. During processing of the substrate 200, the pressure within the interior of the etch chamber 210 is controlled using the gas panel 338 and the throttle valve 227.

The temperature of the chamber wall 230 is controlled using liquid-containing conduits (not shown) that are located in and around the wall. Further, the temperature of the substrate 200 is controlled by regulating the temperature of the support pedestal 216 via a cooling plate (not shown) having channels formed therein for circulating a coolant. Additionally, a back side gas (e.g., helium (He) gas) is provided from a gas source 248 into channels, which are formed by the back side of the substrate 200 and the grooves (not shown) in the surface of the electrostatic chuck 226. The helium gas is used to facilitate a heat transfer between the pedestal 216 and the substrate 200. The electrostatic chuck 226 is heated by a resistive heater (not shown) within the chuck body to a steady state temperature and the helium gas facilitates uniform heating of the substrate 200. Using thermal control of the chuck 226, the substrate 200 is maintained at a temperature of between 10 and 500 degrees Celsius.

A controller 240 may be used to facilitate control of the chamber 210 as described above. The controller 240 may be one of any form of a general purpose computer processor used in an industrial setting for controlling various chambers and sub-processors. The controller 240 comprises a central processing unit (CPU) 244, a memory 242, and support circuits 246 for the CPU 244 and coupled to the various components of the etch process chamber 210 to facilitate control of the etch process. The memory 242 is coupled to the CPU 244. The memory 242, or computer-readable medium, may be one or more of readily available memory such as random access memory (RAM), read only memory (ROM), floppy disk, hard disk, or any other form of digital storage, local or remote. The support circuits 246 are coupled to the; CPU 244 for supporting the processor in a conventional manner. These circuits include cache, power supplies, clock circuits, input/output circuitry and subsystems, and the like. A software routine 204, when executed by the CPU 244, causes the reactor to perform processes of the present invention and is generally stored in the memory 242. The software routine 204 may also be stored and/or executed by a second CPU (not shown) that is remotely located from the hardware being controlled by the CPU 244.

The software routine 204 is executed after the substrate 200 is positioned on the pedestal 216. The software routine 204, when executed by the CPU 244, transforms the general purpose computer into a specific purpose computer (controller) 240 that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

The etching process of the present invention uses a mixture of process gases that provide high etch rate and a high etching selectivity of SLAM to dielectric. The gas mixture comprises a hydrofluorocarbon gas, such as $CHF_3$, $CH_2F_2$, etc., an optional hydrogen-containing gas, such as $H_2$, $NH_3$, etc., an optional fluorine-rich fluorocarbon gas, such as $CF_4$, $C_2F_6$, etc., an oxygen-containing gas, such as $O_2$, CO, etc., a nitrogen-containing gas, such as $N_2$, $NH_3$, $NF_3$, etc., and an inert gas. The inert gas is activated by the energized process gas to sputter and remove dissociated material loosely adhered to the surface of the substrate, thereby, enhancing the photoresist and SLAM etch rate. The inert gas can comprise argon, xenon, neon, krypton, or helium.

One example of the gas mixture comprises $CH_3F$, $H_2$ (optional), $CF_4$ (optional), $O_2$, $N_2$, and Ar. The $CH_3F$ flow rate is between about 5 sccm to about 500 sccm. The $H_2$ flow rate is between about 0 sccm to about 500 sccm. The $CF_4$ flow rate is between about 0 sccm to about 1000 sccm. The $O_2$ flow rate is between about sccm to about 500 sccm. The $N_2$ flow rate is between about 5 sccm to about 500 sccm. The flow rate of Ar is between about 20 sccm and about 2000 sccm. The ratio of $CH_3F$ flow rate to $O_2$ flow rate is between about 1 to about 20. The ratio of $H_2$ flow rate to $O_2$ flow rate is between 0 to about 5. The ratio of $CF_4$ flow rate to $O_2$ flow rate is between about 0 to about 5. The ratio of $N_2$ flow rate to $O_2$ flow rate is between about 1 to about 10. The ratio of Ar flow rate to $O_2$ flow rate is between about 1 to about 30. The bias power is between about 0 watts to about 1000 watts and the source power is between about 50 watts to about 5000 watts. The cathode temperature is between about −20° C. to about 80° C. and the process chamber pressure is between about 0.1 mTorr to about 1 Torr.

Plasma containing hydrofluorocarbon and/or fluorocarbon gases have been used to break Si—O bond in the dielectric material. The etching reaction may include, $$2CF_2 + SiO_2 \rightarrow SiF_4 + CO$$

Since SLAM contains siloxane polymer, it makes sense to include hydrofluorocarbon and/or fluorocarbon gases in the gas mixture to assist in breaking the Si—O bond. The hydrogen-rich fluorocarbon gas can also have another function. Hydrogen-containing gas can provide hydrogen or hydrogen-containing radicals in the etching plasma that, when combined with nitrogen or nitrogen-containing radicals, break the Si—$CH_3$ bond faster, resulting in faster etch rate and higher etch selectivity. The oxygen gas provides oxygen radicals to react with the hydrocarbon components of the organic polymer of the photoresist and SLAM to form gaseous carbon compounds, such as CO, $CO_2$, and hydrogen compounds, such as HF, other carbon-containing or hydrogen-containing gases, that are exhausted from the process chamber. Nitrogen-containing gas in the process gas has been found to help break the Si—$CH_3$ bond A gas mixture containing only fluorocarbon gases (without $CH_3F$), $CF_4$ and $C_4F_6$, $O_2$, $N_2$, and Ar does not yield high selectivity. Increasing the ratio of $C_4F_6$ flow rate to $CF_4$+$C_4F_6$ flow rates degrades the etch selectivity from 1.6 to 1. The studies were conducted using 200 sccm Ar, 0 to 30 sccm C4F6, 5 to 50 sccm $CF_4$, 40 sccm $O_2$, 30 mTorr chamber pressure, 300 watts bias power and 400 watts source power.

The addition of the hydrogen-containing $CH_3F$ gas helps to enhance the SLAM/CDO etch (or removal) selectivity. Table 1 shows the etch selectivity of SLAM to CDO. For example, as the ratio of $CH_3F$ to $CH_3F$ and $CF_4$ increases from 0 to 0.9, the etch selectivity of SLAM/CDO increases from about 1.6 to about 2.8. The studies were conducted under 200 sccm Ar, 0 to 40 sccm $CH_3F$, 5 to 50 sccm $CF_4$, 40 sccm $O_2$, 30 mTorr chamber pressure, 300 watts bias power and 400 watts source power.

TABLE 1

SLAM/CDO etch selectivity as a function of $CH_3F/(CF_4 + CH_3F)$.

| $CH_3F/(CF_4 + CH_3F)$ | SLAM/CDO selectivity |
|---|---|
| 0.0 | 1.6 |
| 0.4 | 1.8 |
| 0.8 | 2.2 |
| 0.9 | 2.8 |

High SLAM/CDO etch selectivity, such as 13, can be achieved without the $CF_4$ gas. However, without the $CF_4$ gas, the etch uniformity for SLAM is poor (as high as 30%) and the etch rate is low (see Table 2). Etch uniformity is defined by dividing the net value of maximum etch thickness subtracting the minimum etch thickness by 2 times the average thickness. The studies were conducted using 200 sccm Ar, 30 to 40 sccm $CH_3F$, 40 sccm $O_2$, 20 sccm $N_2$, 30 mTorr chamber pressure, 300 watts bias power and 400 watts source power.

TABLE 2

SLAM/CDO etch selectivity as a function of $CH_3F$ flow rate.

| $CH_3F$ flow rate, sccm | SLAM/CDO selectivity |
|---|---|
| 30 | 13 |
| 40 | 7.5 |

The addition of $CF_4$ improves etch uniformity and etch rates for both materials, but it shows little effect on SLAM/CDO etch selectivity. A small amount of $CF_4$, such as 10 sccm, can drastically improve etch uniformity and etch rate for both materials (see Table 3). The studies were conducted using 200 sccm Ar, 40 sccm $CH_3F$, 0 to 10 sccm $CF_4$, 40 sccm $O_2$, 20 sccm $N_2$, 30 mTorr chamber pressure, 300 watts bias power and 400 watts source power.

TABLE 3

SLAM and CDO etch rates as a function of $CF_4$ flow rate.

| $CF_4$ flow rate (sccm) | SLAM etch rate (Å/min) | CDO etch rate (Å/min) |
|---|---|---|
| 0 | 800 | 125 |
| 10 | 2500 | 385 |

The addition of $N_2$ also helps improve the SLAM/CDO etch selectivity. By adding 20 sccm $N_2$ to the gas mixture, the SLAM/CDO etch selectivity doubles. However, further increasing $N_2$ from 20 sccm to 40 sccm does not affect the etch selectivity or etch rates of both materials (SLAM and CDO) (see Table 4). The studies were conducted using 200 sccm Ar, 40 sccm $CH_3F$, 10 sccm $CF_4$, 40 sccm $O_2$, 0 to 40 sccm $N_2$, 30 mTorr chamber pressure, 300 watts bias power and 400 watts source power.

TABLE 4

SLAM/CDO etch selectivity as a function of $N_2$ flow rate.

| $N_2$ flow rate, sccm | SLAM/CDO selectivity |
|---|---|
| 0 | 2.2 |
| 20 | 4.0 |
| 40 | 3.9 |

Bias power level affects SLAM etch rate, CDO etch rate and SLAM etch uniformity. Increasing the bias power from 200 watts to 300 watts increases the etch rates for SLAM and CDO, but the increase shows little effect on the SLAM/CDO etch selectivity (see Table 5). Bias power increase is found to reduce (or improve) the SLAM etch non-uniformity significantly. The studies were conducted using 200 sccm Ar, 40 sccm $CH_3F$, 10 sccm $CF_4$, 40 sccm $O_2$, 20 sccm of $N_2$, 30 mTorr chamber pressure, 200 to 300 watts bias power and 400 watts source power.

TABLE 5

SLAM and CDO etch rates as a function of bias power.

| Bias power (watts) | SLAM etch rate (Å/min) | CDO etch rate (Å/min) |
|---|---|---|
| 200 | 1600 | 390 |
| 300 | 2700 | 680 |

Source power level does not affect the SLAM etch rate or CDO etch rate; however, it affects SLAM etch uniformity. Increasing the source power from 400 watts to 800 watts shows no effect on etch rates for SLAM and CDO; therefore, the increase has no effect on SLAM/CDO etch selectivity. However, the 400 watt source power increase would severely degrade the SLAM etch uniformity. The studies were conducted using 200 sccm Ar, 40 sccm $CH_3F$, 10 sccm $CF_4$, 40 sccm $O_2$, 20 sccm $N_2$, 30 mTorr chamber pressure, 300 watts bias power and 400 to 800 watts source power.

Temperature plays a major role in the etch process. Increasing the cathode temperature from $-10°$ C. to $20°$ C. nearly doubles the SLAM/CDO etch selectivity (from 2.1 to 4.0). If the cathode temperature is increased further to $40°$ C., the SLAM/CDO etch selectivity could further increase to 6.7. Changing the cathode temperature can be accomplished by varying the He backside pressure. Backside He has cooling effect and lowering the He pressure could increase the cathode temperature. Changing the cathode temperature to be in the range of $-10°$ C. to $40°$ C. has little effect on the SLAM etch rate. The increase in etch selectivity is mainly cause by the decrease in CDO etch rate at higher cathode temperature (see Table 6). The CDO etch reaction appears to be limited by the adsorption or desorption of reactants and/or products in this temperature range. Since the CDO etch rate decreases from 1250 Å/min to 400 Å/min linearly from $-10°$ C. to $30°$ C., the reaction does not seem to be limited by reactants or products gas phase transportation. Since the reaction rate change is linear, not exponential, the CDO etch reaction also does not seem to be limited by reaction. The only possible explanation is that the CDO etch in this temperature range is limited by surface adsorption or surface desorption of reactants and/or products. The studies were conducted using 200 sccm Ar, 40 sccm $CH_3F$, 10 sccm $CF_4$, 40 sccm $O_2$, 20 sccm $N_2$, 30 mTorr chamber pressure, 300 watts bias power and 400 to 800 watts source power.

TABLE 6

CDO etch rate and SLAM/CDO etch selectivity as a function of cathode temperature.

| Cathode T, (° C.) | CDO etch rate (Å/min) | SLAM/CDO etch selectivity |
|---|---|---|
| -10 | 1250 | 2.1 |
| 20 | 680 | 4.0 |
| 30 | 400 | 6.8 |

The gas mixture used to etch SLAM can also be used to remove the photoresist (PR), such a DUV resist is Apex-E® by Shipley. The photoresist ashing step can be completed in the same chamber used to etch SLAM. The recipe may comprise one single recipe or a two-step recipe with the first step focusing on photoresist ashing. The studies show that the photoresist removal rate is highly affected by the Oxygen ($O_2$) flow rate. Increasing the $O_2$ flow rate from 30 sccm to 40 sccm increases the photoresist removal rate from 1400 Å/min to 2100 Å/min. The selectivity of SLAM to photoresist is between 1.2 and 1.6 (see Table 7), which shows that photoresist removal by this gas mixture is very similar to SLAM. This shows the possibility of combining the photoresist ashing step with the SLAM etch (clean) step. The studies were conducted using 200 sccm Ar, 40 sccm $CH_3F$, 10 sccm $CF_4$, 30 to 40 sccm $O_2$, 20 sccm $N_2$, 30 mTorr chamber pressure, 300 watts bias power and 400 watts source power.

TABLE 7

PR etch rate and SLAM/CDO etch selectivity as a function of O2 flow rate.

| O2 flow rate (sccm) | PR etch rate (Å/min) | SLAM/CDO etch selectivity |
|---|---|---|
| 30 | 1380 | 1.6 |
| 40 | 2100 | 1.2 |

While foregoing is directed to embodiments of the present invention, other and further embodiments of the invention may be devised without departing from the basic scope thereof, and the scope thereof.

What is claimed is:

1. A method for selectively etching a sacrificial light absorbing material over a dielectric material on a substrate, comprising:
    providing a substrate comprising a sacrificial light absorbing material and a dielectric material to a process chamber;
    supplying to the process chamber a process gas mixture comprising a hydrofluorocarbon gas, a nitrogen-containing gas, an oxygen-containing gas, an inert gas, and at least one of a hydrogen-containing gas or a fluorine-rich fluorocarbon gas; and
    dissociating and ionizing the process gas mixture to etch the sacrificial light absorbing material.

2. The method of claim 1 wherein the hydrofluorocarbon gas is $CH_3F$, the flow rate is between about 5 sccm to about 500 sccm and the flow ratio of the hydroflurocarbon gas to the oxygen-containing gas is between about 1 to about 20.

3. The method of claim 1 wherein the hydrogen-containing gas is $H_2$, the flow rate is less than about 500 sccm and the flow ratio of the hydrogen-containing gas to the oxygen-containing gas is less than about 5.

4. The method of claim 1 wherein the fluorine-rich fluorocarbon gas is $CF_4$, the flow rate is less than about 1000 sccm and the flow ratio of the fluorine-rich fluorocarbon gas to the oxygen-containing gas is less than about 5.

5. The method of claim 1 wherein the nitrogen-containing gas is nitrogen, the flow rate is between about 5 sccm to about 500 sccm and the flow ratio of the nitrogen-containing gas to the oxygen-containing gas is between about 1 to about 10.

6. The method of claim 1 wherein the oxygen-containing gas is oxygen and the flow rate is between about 5 sccm to about 500 sccm.

7. The method of claim 1 wherein the inert gas is argon, the flow rate is between about 20 sccm to about 2000 sccm and the flow ratio of the inert gas to the oxygen-containing gas is between about 1 to about 30.

8. The method of claim 1 wherein the sacrificial light absorbing material is 9-anthracene carboxymethyl triethoxysilane (TESAC) dyed methylsiloxane polymer.

9. The method of claim 1 wherein the sacrificial light absorbing material is formed atop a dielectric material, where the dielectric material is a carbon doped oxide with 1 to 50% atomic weight carbon content.

10. The method of claim 1 further comprising:
    applying a bias power of less than 1000 watts.

11. The method of claim 1 wherein the source power is between 50 to 5000 watts.

12. The method of claim 1 wherein the cathode temperature is maintained between −20° C. to 80° C.

13. The method of claim 1 wherein the process pressure is between 1 mTorr to about 1 Torr.

14. The method of claim 1 wherein the etch selectivity of the sacrificial light absorbing material over the dielectric material is higher than 5:1.

15. The method of claim 1 wherein the etch selectivity of the sacrificial light absorbing material over the dielectric material is higher than 10:1.

16. The method of claim 1 wherein the etch rate of the sacrificial light absorbing material is greater than 200 angstrom per minute.

17. The method of claim 1 wherein the etch rate of the sacrificial light absorbing material is greater than 500 angstrom per minute.

18. A method for selectively etching a photoresist material over a dielectric material and selectively etching a sacrificial light absorbing material over a dielectric material on a substrate, comprising:
    providing a substrate comprising a photoresist material, a sacrificial light absorbing material, and a dielectric material;
    supplying to the process chamber a process gas mixture comprising a hydrofluorocarbon gas, a nitrogen-containing gas, an oxygen-containing gas and an inert gas; and
    dissociating and ionizing the process gas mixture to remove the photoresist material and the sacrificial light absorbing material.

19. The method of claim 18 wherein the hydrofluorocarbon gas is $CH_3F$, the flow rate is between about 5 sccm to about 500 sccm and the flow ratio of the hydroflurocarbon gas to the oxygen-containing gas is between about 1 to about 20.

20. The method of claim 18 wherein the nitrogen-containing gas flow rate is between about 5 sccm to about 500 sccm and the flow ratio of the nitrogen gas to the oxygen-containing gas is between about 1 to about 10.

21. The method of claim 18 wherein the oxygen-containing gas is oxygen and the flow rate is between about 5 sccm to about 500 sccm.

22. The method of claim 18 wherein the inert gas is argon, the flow rate is between about 20 sccm to about 2000 sccm and the flow ratio of the inert gas to the oxygen-containing gas is between about 1 to about 30.

23. The method of claim 18 wherein the sacrificial light absorbing material is 9-anthracene carboxymethyl triethoxysilane (TESAC) dyed methylsiloxane polymer.

24. The method of claim 18 wherein the photoresist is a deep ultraviolet (DUV) photoresist.

25. The method of claim 18 wherein the sacrificial light absorbing material is formed atop a dielectric material, where the dielectric material is a carbon doped oxide with 1 to 50% atomic weight carbon content.

26. The method of claim 18, wherein the photoresist is formed atop the sacrificial light absorbing material.

27. The method of claim 18 further comprising:
applying a bias power of less than 1000 watts.

28. The method of claim 18 wherein the source power is between 50 to 5000 watts.

29. The plasma etch process of claim 18 wherein the cathode temperature is maintained between −20° C. to 80° C.

30. The method of claim 18 wherein the process pressure is between 1 mTorr to about 1 Torr.

31. The method of claim 18 wherein the etch selectivity of the sacrificial light absorbing material over the dielectric material is higher than 5:1 and the etch selectivity of the photoresist material over the dielectric material is higher than 5:1.

32. The method of claim 18 wherein the etch selectivity of the sacrificial light absorbing material over the dielectric material is higher than 10:1 and the etch selectivity of the photoresist material over the dielectric material is higher than 10:1.

33. The method of claim 18 wherein the process gas mixture further comprises at least one of a hydrogen-containing gas or a fluorine-rich fluorocarbon gas.

34. The method of claim 33 wherein the hydrogen-containing gas is $H_2$, the flow rate is less than about 500 sccm and the flow ratio of the hydrogen-containing gas to the oxygen-containing gas is less than about 5.

35. The method of claim 33 wherein the fluorine-rich fluorocarbon gas is $CF_4$, the flow rate is less than about 1000 sccm and the flow ratio of the fluorine-rich flurocarbon gas to the oxygen-containing gas is less than about 5.

36. The method of claim 18 wherein the etch rates of the sacrificial light absorbing material and the photoresist are greater than 200 angstrom per minute.

37. The method of claim 36 wherein the etch rates of the sacrificial light absorbing material and the photoresist are greater than 500 angstrom per minute.

38. A plasma etch process for selectively etching a sacrificial light absorbing material over a dielectric material on a substrate, comprising:
providing a substrate comprising a sacrificial light absorbing material and a dielectric material to a process chamber;
supplying to the process chamber a process gas mixture comprising a $CH_3F$ gas flow rate between about 5 sccm to about 500 sccm, a nitrogen gas flow rate between about 5 sccm to about 500 sccm, an oxygen gas flow rate between about 5 sccm to about 500 sccm, an argon gas flow rate between about 20 sccm to about 2000 sccm, and at least one of hydrogen ($H_2$) at a gas flow rate of less than about 500 sccm or fluorocarbon ($CF_4$) at a gas flow rate of less than about 1000 sccm, the ratio of $CH_3F$ flow rate to oxygen flow rate is between about 1 to about 20, the ratio of nitrogen flow rate to oxygen flow rate is between about 1 to about 10, and the ratio of Ar flow rate to oxygen flow rate is between about 1 to about 30;
supplying the process chamber with a bias power of less than about 1000 watts and a source power between about 50 watts to about 5000 watts,
maintaining the cathode temperature between about −20° C. to about 80° C. and chamber pressure between about 1 mTorr to about 1 Torr; and
dissociating and ionizing the process gas mixture to etch the sacrificial light absorbing material.

39. The method of claim 38 wherein a gas flow rate of hydrogen ($H_2$) or fluorocarbon ($CF_4$) to oxygen is less than about 5.

40. A method for selectively etching a sacrificial light absorbing material over a dielectric material on a substrate, comprising:
providing to a process chamber a substrate comprising a dielectric material having a via formed therein, a sacrificial light absorbing material disposed atop the dielectric material and filling the via, and a photoresist layer disposed atop the sacrificial light absorbing material and patterned to define a trench aligned with the via;
etching the trench into the sacrificial light absorbing material and the dielectric material, wherein at least a portion of the sacrificial light absorbing material remains deposited within the via upon completion of etching the trench; and
removing the photoresist layer and the remaining portion of the sacrificial light absorbing material deposited within the via using a plasma formed from a process gas mixture comprising a hydrofluorocarbon gas, a nitrogen-containing gas, an oxygen-containing gas, and an inert gas.

41. The method of claim 40 wherein the process gas mixture further comprises at least one of a hydrogen-containing gas or a fluorine-rich fluorocarbon gas.

* * * * *

UNITED STATES PATENT AND TRADEMARK OFFICE
CERTIFICATE OF CORRECTION

PATENT NO.        : 7,309,448 B2                                           Page 1 of 1
APPLICATION NO.   : 10/706902
DATED             : December 18, 2007
INVENTOR(S)       : Hee Yeop Chae et al.

It is certified that error appears in the above-identified patent and that said Letters Patent is hereby corrected as shown below:

In column 8, line 16, after "$O_2$ flow rate is between" replace "about sccm to about 500 sccm" with --about 5 sccm to about 500 sccm.--

Signed and Sealed this

Third Day of June, 2008

JON W. DUDAS
*Director of the United States Patent and Trademark Office*